United States Patent [19]

Weidler

[11] 4,136,269

[45] Jan. 23, 1979

[54] SPRING SWITCH FOR MOUNTING ON A CIRCUIT BOARD SUBSTRATE

[75] Inventor: Charles H. Weidler, Lancaster, Pa.

[73] Assignee: AMP Incorporated, Harrisburg, Pa.

[21] Appl. No.: 737,811

[22] Filed: Nov. 1, 1976

Related U.S. Application Data

[63] Continuation of Ser. No. 491,425, Jul. 24, 1974, abandoned.

[51] Int. Cl.² .............................................. H01H 5/18
[52] U.S. Cl. .............................. 200/67 D; 200/159 A; 200/243
[58] Field of Search .................. 200/159 A, 5 A, 292, 200/159 R, 159 B, 5 R, 16 A, 239, 243, 245, 67 D, 67 DB

[56] References Cited

U.S. PATENT DOCUMENTS 3,133,170  5/1964  Nanninga ........................... 200/67 D

FOREIGN PATENT DOCUMENTS 655549  7/1951  United Kingdom ............... 200/67 DB Primary Examiner—Samuel W. Engle
Assistant Examiner—Ralph Palo
Attorney, Agent, or Firm—Frederick W. Raring

[57] ABSTRACT

A spring switch for mounting on a circuit board substrate includes a spring contact element formed from a strip of metal having spring-like characteristics and comprising a convex or curved portion with support legs at each end thereof. The convex spring portion is monostable in nature but capable of assuming two states, one state being stable and the other state being unstable. Upon application of pressure thereto the convex spring portion will deform from its stable state to its unstable state, and thereby make contact with an underlying second contact element. Upon removal of the pressure, the convex portion snaps or springs back to its original, stable convex position. A pair of spades are attached to the legs, to be insertable in and through holes in the circuit board substrate, to secure the spring element to the substrate. A key of insulating material rides normally above the convex portion to enable downward pressure to be applied to said convex portion to deform it to the contacting posture.

3 Claims, 5 Drawing Figures

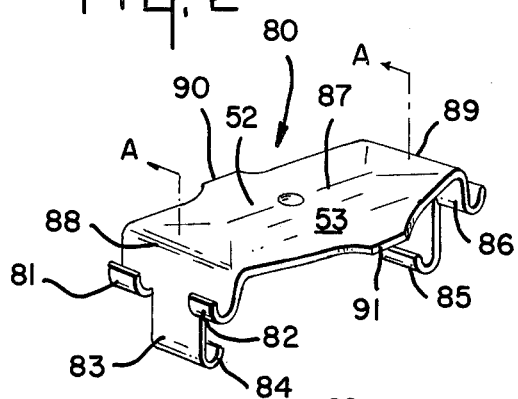
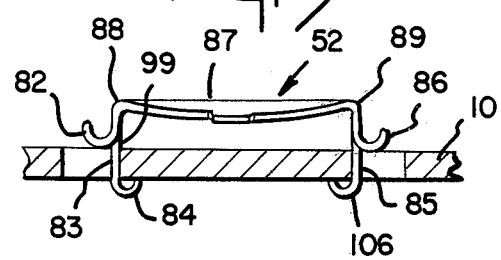
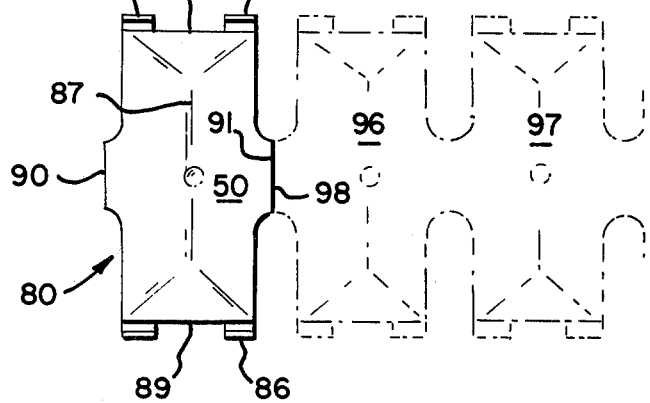
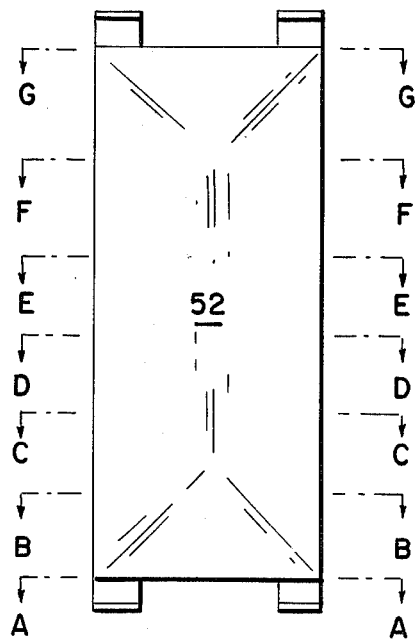
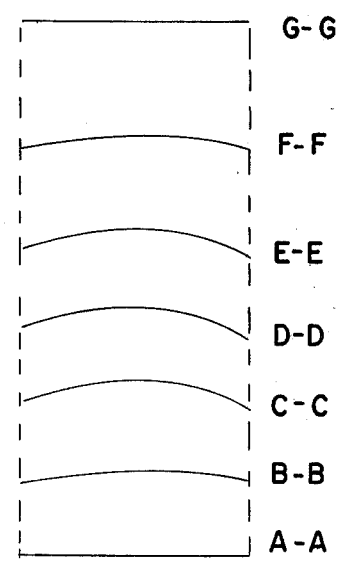
PROFILES OF CROSS-SECTIONS

SPRING SWITCH FOR MOUNTING ON A CIRCUIT BOARD SUBSTRATE

CROSS-REFERENCES TO RELATED APPLICATION

This application is a continuation of application Ser. No. 491,425 filed July 24, 1974, now abandoned by Charles Harry Weidler and entitled "Spring Switch For Mounting On a Circuit Board Substrate".

BACKGROUND OF THE INVENTION

1. Field of the Invention

This invention relates to improvements in electrical switches, and more particularly to improvements in spring switches of the type mountable on a circuit board substrate or the like.

2. Description of the Prior Art

Recently much emphasis has been placed upon the development of inexpensive miniature switches, for use, for example, in applications such as on the keyboards of pocket or desk size miniature calculators, and other apparatuses of similar size and physical similarity. To date, however, the switches which have been employed are usually either undesirably expensive, or require considerable precision in installation. The greater the degree of precision required for installation naturally increases the ultimate expense of the overall assembled switch.

One switch which has been advanced is a disk which is located directly over a number of wires or contacts between which electrical connection is desired. Upon application of a downward pressure upon the disk, it snaps from a generally concave posture in the direction of the contacts to a generally convex posture, thereby coming into contact with all of the desired contact elements. Usually such type switches are gold plated on their underside portions which contact the conductors to present minimum resistance when the switch is closed. However, because of the expense of the gold materials, the gold is plated only upon a minimum area on the disk. Consequently, precise alignment is required in the assembly of the disk upon the wires or other elements between which the switch connection is made.

In the manufacture of such disk devices, the disks are placed in holes of a previously formed mask, then a thin film of plastic or other flexible material is laid over the disks to secure them permanently to the printed circuit board within the proper position in the holes of the mask. Many problems are encountered, especially in the handling of the partially manufactured switches, in keeping the disks in the proper alignment upon the printed circuit board until the plastic or other protective layer is emplaced.

Finally, a key or other button type element is placed over the disk to transmit pressure thereto to cause it to snap from the concave to convex postures as above described.

Other types of snap switches have been proposed, such as multiple bar contacts and snap switch strips. The details of such switches can be seen in *Product Engineering*, September, 1972, page 42 et seq.

Nevertheless, in the installation of such switches, as mentioned above, a number of precision parts must be assembled, or the particular parts employed are of relatively high cost, especially with respect to the gold plated elements thereof.

Another disadvantage of the spring type switches heretofore advanced is that because of the number of parts, and the very precision alignment ordinarily required in their assembly, usually machine or automated assembly is impractical or highly inefficient. This is especially true in switches in which, for example, four or more relatively complicated component parts are stacked or aligned before connection upon a printed circuit board or the like.

SUMMARY OF THE INVENTION

In light of the above, it is an object of the invention to present an inexpensive snap or spring or type switch.

It is another object of the present invention to present a snap type switch which can be installed readily with automated machinery.

It is yet another object of the invention to present a switch which is of relatively simple construction and of reliable operation.

It is still another object of the invention to present a snap or spring type switch which can be employed in pocket size electronic calculators or the like.

It is yet another object of the invention to present a switch of the type which can be implaced in a desired location upon a printed circuit board, and which will remain in the location without special holding or securing precautions.

It is another object of the invention to present a switch in which the precise implacement of the parts is not critical.

It is yet another object of the invention to present a switch in which multiple layers of materials are not required in fabrication and construction.

These and other objects, features, and advantages will become apparent to those skilled in the art from the following detailed description when read in conjunction with the accompanying drawings and appended claims.

The switch, in accordance with a preferred embodiment of the invention, in its broad aspect, presents an assembly for mounting upon a substrate of such as a printed circuit board. Additionally, a switch contact for use in the fabrication or construction of a switch, in accordance with the invention, is presented. The switch includes a contact carried upon the substrate in electrical connection with one of the conducting leads. A second contact is located over the first contact in electrical connection with another one of the conducting leads of the substrate. The second contact includes a strip of spring material overlying and normally away from the first contact, and comprising a convex portion. A pair of legs at each end of the strip of spring material support said strip upon the substrate above the first contact, whereby when a downward pressure is applied to said strip of spring material, the convex portion thereof will deform downwardly, making electrical connection with the first contact. When the downward pressure is released, the convex portion will spring or pop the entire strip back to its original position overlying and away from the first contact. Tab means, or stakes, extend from the legs for insertion into holes in the substrate. A shoulder portion is formed on each of the tab means to engage the substrate within the hole through which it is inserted, thereby securing the position of the strip upon the substrate. A button or key member is positioned on top of the strip, on or near the convex portion, for transmitting a downward pressure to the strip to deform it as discussed above.

In another embodiment of the invention, a protrusion is provided upon the side of the strip nearest the first contact element to define a point connection with said underlying first contact upon deformation of the strip by pressure thereon.

BRIEF DESCRIPTION OF THE DRAWINGS

The above-mentioned and other objects and features of the invention will be more fully understood from the following detailed description thereof when read in conjunction with the drawings in which:

FIG. 2 is a perspective view of one form of the spring switches;

FIG. 3 is a sectional view of the spring switch of FIG. 2 down along the plane A—A;

FIG. 4 is a top view of the structure of FIG. 1; and

FIG. 5 is another top view of the structure of FIG. 1, but also showing profiles of cross-sections of the spring switch at various points along its length.

DETAILED DESCRIPTION OF THE PREFERRED EMBODIMENTS

Figure 1:
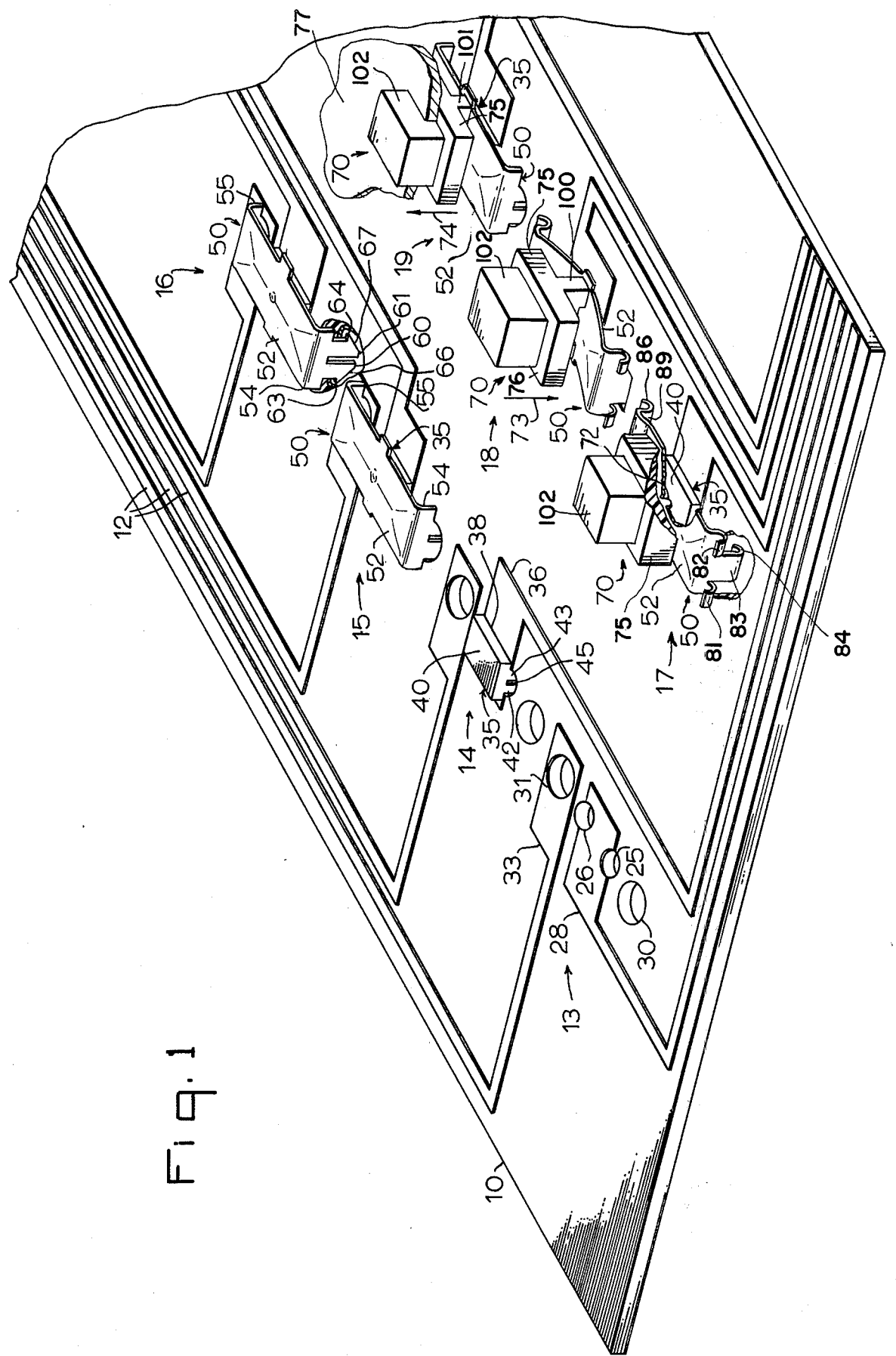
FIG. 1 shows a perspective view of a part of a circuit board upon which a plurality of spring switches in various stages of construction are shown with portions of the switches and the printed circuit board cut away to show details of construction.

The switch of the invention is primarily intended for mounting upon a substrate 10, as shown in FIG. 1, which can be, for example, be substrate of a printed circuit board or the like. Such printed circuit board substrates are typically of an insulation material, such as fiberglass, plastic, paper or the like. A number of electrically conducting leads 12 are preformed on the board, in accordance with well known printed circuit board fabrication techniques, leading, for example, to the various sites on the surface of the substrate 10 at which the mounting of the switches is desired. As shown, the sites 13, 14, 15, 16, 17, 18 and 19 can correspond to the final locations of the push buttons or other switch activating means. In the fabrication of the switch, in accordance with the invention, as shown serially at the locations 13–16, holes are first formed in the printed circuit board substrate, preferably through the conductor lead elements thereon to which electrical connection is desired. For example, at the location 13, holes 25 and 26 are formed adjacent a printed circuit board lead 28 to which connection is to be made by the center contact of the switch. Likewise, outside holes 30 and 31 are formed on each side of the location of the center contact. The hole 31 is formed in and through the printed circuit board lead 33 to which electrical connection by the second or outside contact element is made.

Although not shown, additional electrical connections can be made to the contact element of the switch by leads on the underside of the printed circuit board substrate 10 (not shown) as desired.

As shown at the location 14, in the fabrication of the switch, a first switch contact 35 is implaced in the central location of the switch, upon a printed circuit board lead 36. The contact 35 includes a main body portion 38, which in the embodiment illustrated is essentially a block of conducting material having a top face 40 which can be substantially flat. Downwardly extending from the body 38 are a pair of legs or tabs 42 and 43, which are of length sufficient to extend completely through the hole 45 through the substrate. Similar tabs (not shown) downwardly extend from the opposite side of the body 38 similar to the hole 45 shown. The tabs 42 and 43 can include shouldered members of shape and construction which can be similar to the shouldered members below described in detail with reference to the outside or second conductor element (shown particularly at location 16 on the substrate 10).

After the first contact element 35 has been inserted, the outer or second contact element 50, shown at location 15 on the substrate 10, is inserted. The second conductor element is formed from a spring type metal, which can be formed from a single piece of material to the general shape shown.

The second contact element 50 comprises a strip 52 of spring-like material, at least a portion of which is generally convex on the top surface 53, as shown in FIG. 1, and generally concave on the underside surface which faces the contact 35 thereunder. The surfaces are preferably concave and convex in orthogonal coordinates, i.e., along the length of the strip 52 and also at right angles thereto across the width of the strip 52. This convex configuration provides a snap-like switching action of strip 52 when it is depressed, as by applying a force on the top surface 53 thereof. More specifically, when a force is applied to the top surface 53 of strip 52 the said strip 52 will snap or pop down and make contact with the contact 35 lying thereunder. The snap-like action of the strip 52 is monostable in nature and has basically two states, one of which is a stable state, and the other of which is a non-stable state; hence the descriptive term "monostable" is employed.

When the force is applied to the top surface 53 of strip 52, the strip 52 is caused to be forced out of its stable state and into its bi-stable state, as shown in FIG. 1 at locations 18 and 19 passing through the snap-like action during the transition from the stable to the non-stable state.

Upon release of the force, the strip 52 will immediately snap back from its unstable state to its stable state, as shown at location 19 in FIG. 1.

It is to be understood that there are many different configurations of spring-like material, other than the one shown in FIG. 1, which will produce the snap-like switching action with the monostable characteristic. A familiar example is the "cricket" toy, popular among children and which has a strip of convex, spring-like metal secured at one end to a backing element to form a "V" configuration therewith. When the spring-like element and the backing element are squeezed together the spring-like element snaps from its stable state to its non-stable state, making a clicking or popping noise as it does so. At each end of the strip 52 the edges are bent generally perpendicularly downwardly therefrom to form legs 54 and 55 to support the strip 52 in a position essentially parallel to the surface of the substrate 10. Additionally, the legs 54 and 55 are of such length that the convex portion 53 is maintained in the normal posture as shown, overlying and away from the first contact element 35.

To maintain the second contact element 50 in its located position upon the printed circuit board substrate, a pair of tabs or stakes 60 and 61 are provided on the leg 54, as shown particularly in the cut away portion of the substrate at location 16. Similar tabs or stakes (not shown) are provided on the opposite leg 55. To secure the second contact 50 in the located position, shoulders 63 and 64 are provided on each of the tabs 60 and 61, and, likewise, shoulders are provided on the tabs on the opposite leg 55. Thus, when the second contact element 50 is inserted into the holes at the desired locations, the stakes 60 and 61 are moved together by the walls of the hole into which it is inserted bearing upon the tapered surfaces 66 and 67 until the shoulders 63 and 64 have been pushed or inserted completely through the hole. At that point, the tabs or stakes 60 and 61 spring outwardly and the shoulders 63 and 64 engage the underside of the substrate 10, thereby securing or staking the second conductor contact 50 therein.

Another means of staking the strip 52 in the circuit board 10 is shown at site 17 of FIG. 1 wherein the staking means comprises a leg 110 having a staking means 83 with a bent-over spring-like tab 84 at the end thereof. A similar leg 89 with a similar staking means 111 (FIG. 2) having a bent-over tab 85 is formed on the other end of strip 52. These two legs 83 and 89 are pressed into rectangular holes, such as hole 99 in FIG. 3, formed in the circuit board 10.

The two tab-like members 81 and 82, in FIG. 1, on either side of the leg 83 form shoulders which rest upon the top surface of the circuit board 10 and determine the height of the strip 52 over the contact element 35 thereunder. The curved end 84 on the leg 83 snaps outwardly after the leg 83 is forced through the hole 99 (FIG. 3) in circuit board 10 to lock the contact 50 upon said circuit board 10.

As shown at location 17, a button or key 70 is located directly above and normally resting upon the second conductor element 50. Similar buttons or keys 70 are also shown as being located at sites 18 and 19 and, although not shown in the figure, are also located at all other sites, such as sites 13, 14, 15 and 16.

Each of the keys 70 has three principal parts; a top portion 102 which is generally rectangular in shape; a center portion 75 which is also generally rectangular in shape but larger than the top section 102 so as to create a shoulder portion 76 extending around the base of the top portion 102; and a third portion 101 which is a relatively narrow element extending transversely across the strip 52 and which functions to transmit the force applied to the top of the key 70 down to the spring strip element 52.

As shown at site 19 at retaining bracket or frame 77 fits over the top portions 74 of the buttons 70 and rests upon the shoulders 76, thereby maintaining buttons 70 over the spring contact 52 thereunder and at a desired height. The frame 77 has a pattern of rectangularly shaped holes therein which coincide with the pattern of the location of the buttons 70 and of a size as to fit over the top portions 74 and rest upon the shoulders 76 of buttons 70. By means not shown in the figure the bracket 77 is secured in a fixed relationship with the printed circuit board 10. Thus, when a key 70 is manually pressed downward upon the spring contact 52 thereunder, the shoulder 76 leaves the supporting bracket 77 and the key applies a pressure to the spring contact 52 thereunder. When the pressure is released from the key 70, the said key 70 is forced back upwardly by the spring action of key 70, and thereby forcing the shoulder 76 up against the bracket 77.

In the normal open position shown, no electrical connection is made between the second conductor 50 and the first conductor 35. When, however, a downward pressure is exerted upon the button 70, in the direction of the downward arrow 73 at switch location 18, the convex portion 53 of the second contact 50 deforms downwardly. When the convex portion 53 is deformed to the position shown in location 18, it comes into contact with the first contact element 35. To insure good electrical contact between the second contact 50 and the first contact 35, an embossment 72 is provided on the underside of the strip 52. (See location 15). It can therefore be seen that because of the point contact established between the second contact member 52 and the first contact member 35, the relative positioning of the two contacts 52, 35 is not critical, as long as the embossment 72 can be brought to bear upon some portion of the flat surface 40 of the first contact 35.

To enhance the electrical connection between the top contact 50 and the bottom contact 35, a portion of the bottom side of the contact 50 can be plated with a high conductivity type material such as gold or the like (not shown). The gold or other plating can be conveniently applied in the form of a stripe following a path including the protrusion 72 to the legs on each side of the top 52. Because the contact 50 need only touch the top surface 40 of the bottom contact 35, little precision is required in the location and positioning of the gold stripe applied.

As shown at the location 19, after the downward pressure upon the button 70 is released, the spring action of the convex portion 53 of strip 52 will cause strip 52 to spring upwardly, as shown by arrow 74, to the original position overlying and away from the first contact member 35.

It can be seen that since a considerable degree of latitute is available in the positioning and the dimensions of the holes into which the contact elements can be inserted, and once the elements are, in fact, inserted, considerable latitude is permitted for aligning the first and second contact members, the fabrication of the switches, in accordance with the principles of the invention, is particularly well suited for automatic machinery. For example, the printed circuit board substrate 10 can be positioned automatically along predefined X and Y axes and stopped at the desired location for insertion of the first and second contact members 35 and 50. After the members 35 and 50 are inserted, because of the securing action of the shouldered tabs extending through the holes of the substrate, the contact of the switch elements are essentially maintained in the desired fixed locations. Thereafter, the tab portions extending through the substrate can be soldered, such as by automatic wave soldering techniques, or other suitable methods, to the leads of the underside of the substrate 10. It should be noted that although such soldering is not essential to the actual operation of the switch, it is nevertheless preferably to assure a quality electrical connection between the switch elements and the leads of the printed circuit board upon which it is installed.

It should be also noted that because of the noncritical placement requirements of the switch, a large degree of flexibility is permitted, for example, in designing the overall size of the switches, the amount of travel between the open and closed positions of the switches, and the degree of amount of return spring action presented by the top contact member.

In another embodiment of the invention, not illustrated, the contact element 50 can be fabricated with only a single support leg. For example, as shown at the location 16, the second support leg 55 in some installations can be deleted. Thus, the convex strip 52 will be, in such embodiment, cantilevered upon the first support leg 54, and moved upwardly and downwardly with the same type spring action as above described.

It should also be noted that although the first electrical contact member 35, shown particularly at location 14, has been shown with a solid block or body 38, any type of structure presenting an essentially flat contact surface can be employed. For example, it is possible to omit the first contact element entirely, and to fabricate the height of the strip 52 of the second contact element 50 in a manner such that upon deformation thereof it will come into contact directly with a contact area on the printed circuit board itself. Alternatively, the first contact element 35 can be constructed in a manner similar to that of the second contact element 50, but of course, with the center top surface 40 not possessing the deformability of the strip 52 of second contact 50. By constructing contact element 35 in a manner otherwise similar to that of contact 50, said contact 35 can bridge over conductive paths on circuit board 10 without making contact therewith.

Referring now to FIGS. 2, 3, 4, and 5 there are shown more details of a spring contact member of the type shown at site 17 in FIG. 1.

In FIG. 2 the convex portion 53 of the strip 52 is more clearly shown. One means by which such a convex configuration of strip 52 can be formed is as follows. A strip of flat, spring-like material is first deformed so that its cross-sectional profile perpendicular to its length is generally curved in nature. The ends of the strip are then stamped and bent downwardly to form the staking legs or tabs, such as is shown in FIG. 2, and which include, for example, the legs 83 and 85 and the tabs 81, 82 and 86. The lines of bending identified by reference characters 88 and 89 shown in FIG. 2, are essentially straight lines, thereby making the cross-sectional profile of the ends of the strip 52 fairly straight and the cross-sectional profile of the center of strip 52 curved, to produce the desired convex configuration.

In FIG. 3 it can be seen how the legs 83 and 85 are inserted through holes, such as holes 99 and 106, in circuit board 10 so that the bent over tabs, such as tab 84, lock on the underside of the board 10. The tabs 82 and 86 of FIG. 3 form shoulders which rest upon the top surface of board 10 and determine the distance of the strip 52 from said top surface of board 10. The reference character 87 identifies the crown or the topmost portion of strip 52 when viewed from the side.

The spring-like contacts 50, as shown in FIG. 2, can be made from a continuous strip of metal, as shown in FIG. 4, joined together by small connecting sections, such as section 107 shown in FIGS. 4 and 2. When the continuous strip of contacts 50, 96 and 97 of FIG. 4 are separated the connecting elements, such as connecting element 107, is cut along a line 98, leaving the small tabs 90 and 91 thereon, which are in fact unnecessary to the device and are only a result of the manufacturing technique.

In FIG. 5 there is shown another top view of the structure of FIG. 2 with profiles taken along the planes A—A through G—G. It can be seen that these profiles of the cross-section of the strip 52 are substantially straight at the two ends A—A and G—G and become progressively and increasingly curved, reaching the highest degree of curvature at the center cross-sectional profile D—D.

Although various forms of the invention have been described and illustrated herein, it is understood that the present disclosure is only by way of example and that numerous changes in the details of construction and the combination and arrangement of parts may be made without departing from the spirit and scope of the invention.

I claim:

1. A switch contact comprising:
   a single piece of spring metal formed into a "U" shaped configuration having a top portion and support and staking legs perpendicular therewith for insertion into holes in a substrate;
   each of said legs configured to securely engage at a predetermined depth of insertion, the edges of the substrate hole into which it is inserted to secure said switch to said substrate with said top portion above and generally parallel with said substrate;
   said top portion constructed to have a stable state and a non-stable state and to respond to a force applied thereon in the direction of said substrate to deform from said stable state into said non-stable state in the direction of the substrate and upon removal of said force, to spring back to its stable state.

2. The switch contact of claim 1 wherein said top portion comprises a protrusion on the substrate facing surface of the top portion of the "U" shaped configuration to enable point electrical contact to be made between said protrusion and the surface of said substrate.

3. A switch contact comprising:
   a single piece of spring metal formed into a "U" shaped configuration having a top portion and at least one support leg perpendicular therewith for insertion into a hole in a substrate;
   said leg configured to securely engage at a predetermined depth of insertion, the edges of the substrate hole into which it is inserted to secure said switch to said substrate with said top portion above and generally parallel with said substrate;
   said top portion having a surface concave in orthogonal coordinates facing said substrate and an opposing surface convex in orthogonal coordinates facing away from said substrate and constructed to have a stable state and a non-stable state and to respond to a force applied thereon in the direction of said substrate to deform from said stable state into said non-stable state in the direction of the substrate and upon removal of said force, to spring back to its stable state.

* * * * *